(12) United States Patent
Kejariwal et al.

(10) Patent No.: US 7,521,951 B1
(45) Date of Patent: Apr. 21, 2009

(54) NON-INVASIVE, LOW PIN COUNT TEST CIRCUITS AND METHODS UTILIZING EMULATED STRESS CONDITIONS

(75) Inventors: Murari Kejariwal, Austin, TX (US); John Laurence Melanson, Austin, TX (US); Ammisetti V. Prasad, Austin, TX (US); Sherry Xiaohong Wu, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 280 days.

(21) Appl. No.: 11/402,508

(22) Filed: Apr. 12, 2006

Related U.S. Application Data

(63) Continuation of application No. 10/464,212, filed on Jun. 18, 2003, now abandoned, which is a continuation-in-part of application No. 10/027,187, filed on Dec. 20, 2001, now Pat. No. 6,937,046.

(51) Int. Cl.
*G01R 31/02* (2006.01)

(52) U.S. Cl. .................................... 324/763

(58) Field of Classification Search ................. 324/765, 324/158.1, 763, 760; 714/724, 733–735; 438/14, 17–18; 257/48
See application file for complete search history.

(56) References Cited

U.S. PATENT DOCUMENTS 5,384,533 A * 1/1995 Tokuda et al. ............ 324/158.1
6,118,293 A * 9/2000 Manhaeve et al. .......... 324/765

* cited by examiner

*Primary Examiner*—Ha Tran T Nguyen
*Assistant Examiner*—Tung X. Nguyen
(74) *Attorney, Agent, or Firm*—James J. Murphy; Thompson & Knight LLP

(57) ABSTRACT

A method of testing an internal block of an integrated circuit includes initiating a test mode and verifying an operation of the integrated circuit under a more stringent condition in the test mode as compared to a condition in another operating mode such that proper operation of the integrated circuit is assured in the another operating mode. A test signal is selectively output from a selected pin in the test mode indicative of the operation of the internal block, wherein the selected pin is utilized for exchanging another signal when the integrated circuit is in the another operating mode.

7 Claims, 12 Drawing Sheets

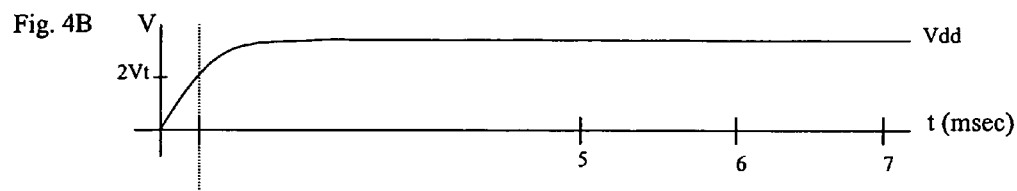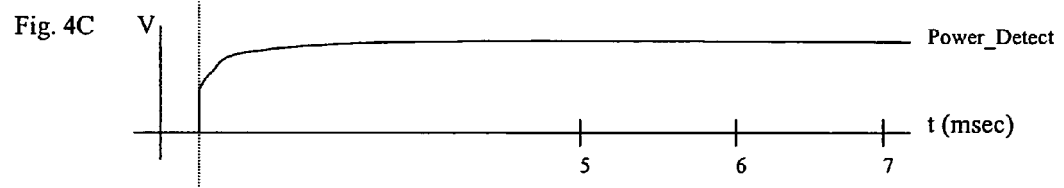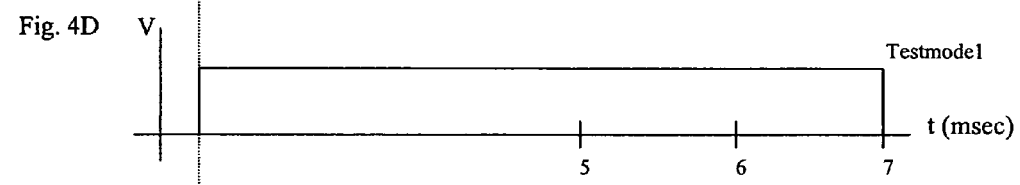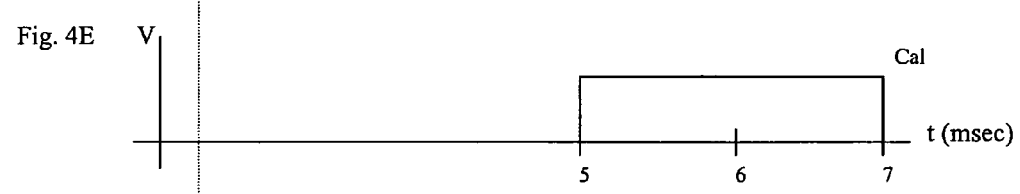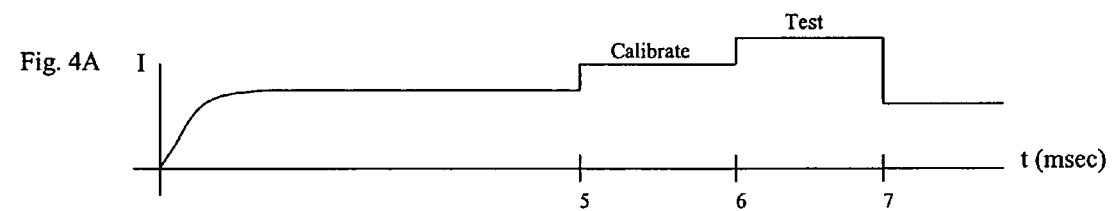

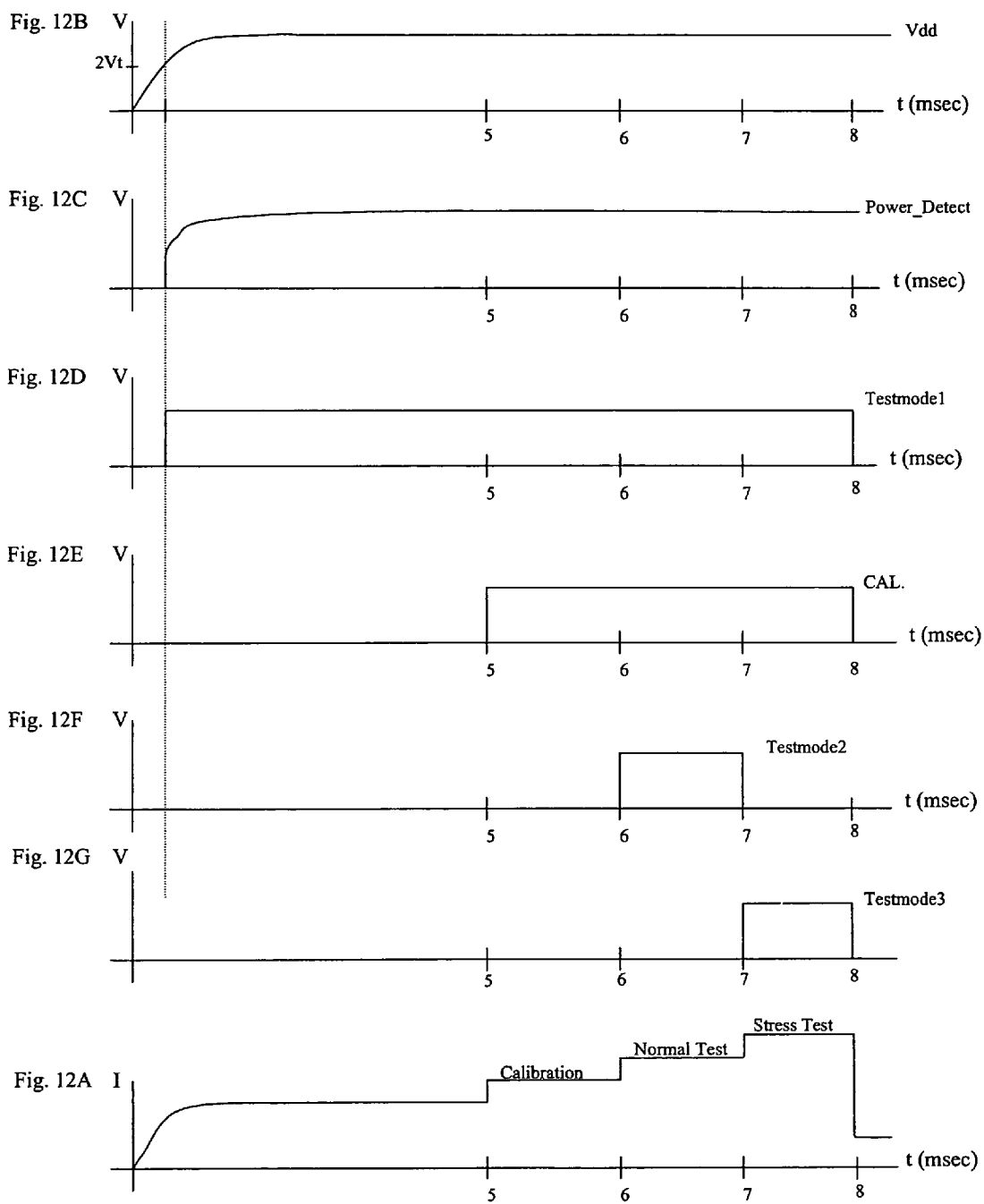

NON-INVASIVE, LOW PIN COUNT TEST CIRCUITS AND METHODS UTILIZING EMULATED STRESS CONDITIONS

CROSS REFERENCE TO RELATED APPLICATIONS

This application for patent is a continuation of U.S. patent application Ser. No. 10/464,212, filed Jun. 18, 2003 now abandoned, which is a continuation-in-part of U.S. patent application Ser. No. 10/027,187, filed Dec. 20, 2001 now U.S. Pat. No. 6,937,046.

FIELD OF INVENTION

The present invention relates in general to integrated circuits and in particular, to non-invasive, low pin-count test circuits and methods utilizing emulated stress conditions.

BACKGROUND OF INVENTION

Testing integrated circuits typically involves the evaluation of important parameters at various operational levels under differing operating conditions, such as temperature. For example, the overall operation of the chip may be tested in addition to the specific testing of particularly critical circuits or circuit blocks. This testing is especially important with respects to complex integrated circuits in which the overall operation of the device may fall within specifications, but the operation of one or more internal circuit blocks is nonetheless only marginal.

The actual implementation of an efficient test protocol for a given chip is a non-trivial task subject to many variables. Among other things, if on-chip test circuitry is to be used, that test circuitry must be non-invasive. In other words, the operation of the test circuitry should not in itself alter any of the critical operating parameters of the device or disturb a critical signal path. Additionally, depending on packaging limitations, it is not always practical to provide sufficient pins for observing all the internal circuits requiring test. Further, notwithstanding the problem of access, ways of triggering the internal circuitry test mode must be provided. Finally, some decision must be made as to which parameters and nodes are to be tested.

Given the importance of testing at various operational levels of an integrated circuit, improved testing techniques are required. These techniques should be non-invasive, neither disturbing critical signal paths nor dictating undue changes in the physical configuration device or packaging. They should be flexibly amenable to the testing of various nodes and parameters on the integrated circuit in a time-efficient fashion.

SUMMARY OF INVENTION

The principles of the present invention allow potential failures of an integrated circuit under stress to be detected from testing performed under nominal (ambient) test conditions. According to one particular embodiment of these principles, a method of testing an internal block of an integrated circuit is disclosed which includes testing an internal block under a selected operating condition by setting a selected operating parameter to a value emulating operation of the internal block under another operating condition to detect potential failure of the internal block under the another operating condition.

Advantageously, the principles of the present invention allow for the testing of embedded circuits in an integrated circuit chip using a streamlined test protocol. Specifically, by varying a selected operating parameter, such as bias current, stress conditions for one or more of the embedded blocks are emulated. The integrated circuit chip is then tested in nominal test conditions to detect embedded blocks, which have a probability of failing under those stress conditions. Hence, the need to perform testing under actual stress conditions to detect marginal or failing parts is substantially reduced or eliminated.

BRIEF DESCRIPTION OF DRAWINGS

For a more complete understanding of the present invention, and the advantages thereof, reference is now made to the following descriptions taken in conjunction with the accompanying drawings, in which:

FIG. 4A illustrates an exemplary power current profile illustrating the modulation of the power supply current during the test phase shown in FIG. 3;

FIGS. 4B-4F are voltage versus time diagrams of exemplary timing signals controlling the operating regimes of FIG. 3 as generated by the state machine of FIG. 1;

FIGS. 12A-12G are voltage versus time diagrams of exemplary timing signals controlling the operating regimes of FIG. 11 as generated by the state machine of FIG. 9.

DETAILED DESCRIPTION OF THE INVENTION

The principles of the present invention and their advantages are best understood by referring to the illustrated embodiment depicted in FIGS. 1-12 of the drawings, in which like numbers designate like parts.

Figure 1:
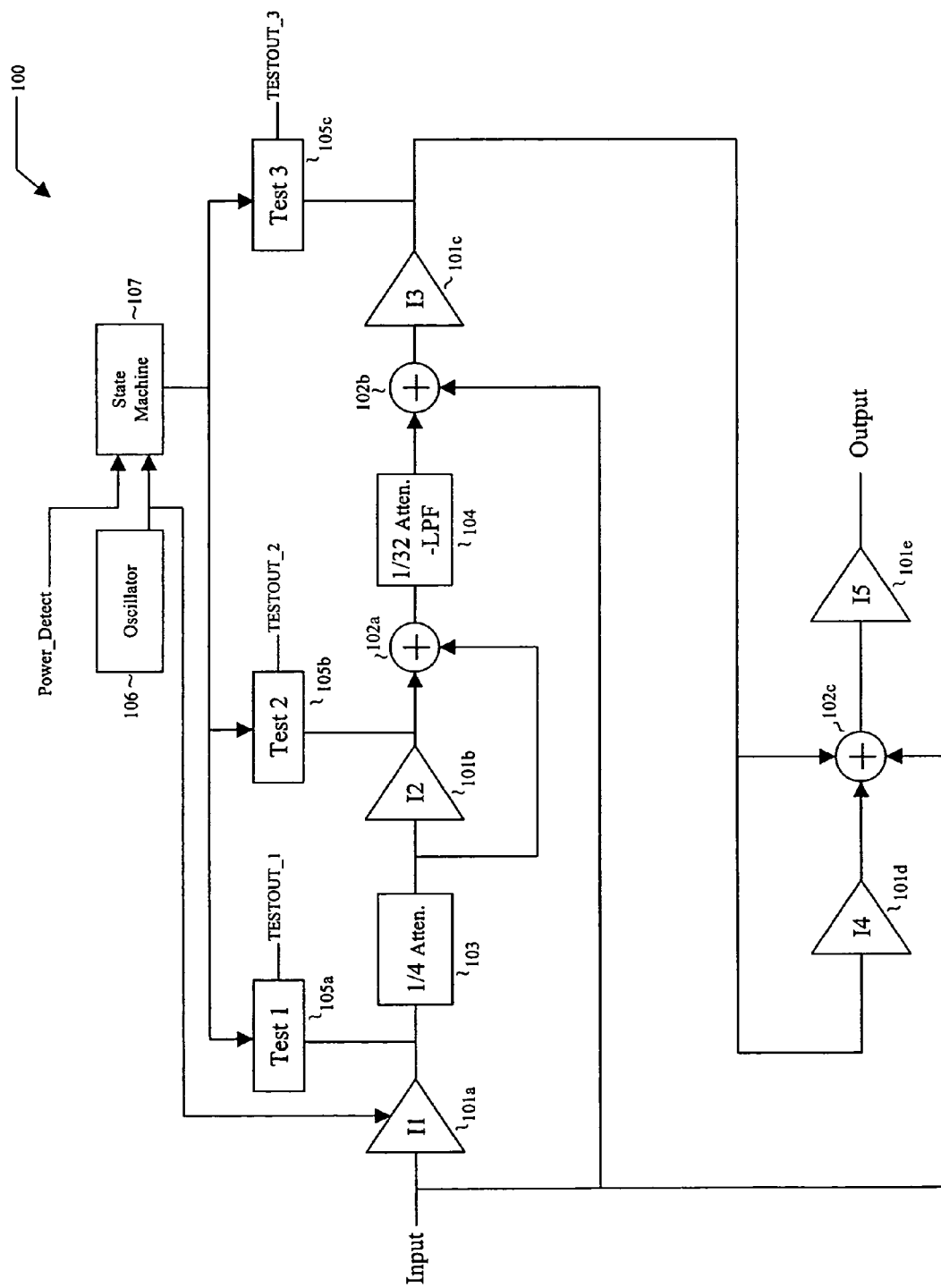
FIG. 1 is a operational block diagram of an exemplary multipath feedforward operational amplifier embodying the present inventive principles.

FIG. 1 is a operational block diagram of a feed-forward operational amplifier 100, fabricated on a single chip, and embodying the principles of the present invention. (Opamp 100 is only one of a number of possible applications of these principles, which are particularly useful in instances where testing of deeply embedded circuits is required and/or the number of pins or pads available for parameter observation is limited).

Opamp 100 is based on five (5) integrator stages 101a to 101e. In the preferred embodiment, integrator stage 11 is chopper-stabilized, as discussed in further detail below. A set of summers 102a to 102c implement the feed-forward operation. The primary data path also includes ¼ attenuator 103 and ¹⁄₃₂ attenuator—low pass filter (LPF) 104.

According to the present inventive principles, three test blocks 105a to 105c are provided to monitor three selected nodes representing corresponding state variables in opamp 100. In the preferred embodiment, the data paths through opamp 100 are differential and test blocks 105a to 105c, which monitor the differential voltage between the conductor pairs, although other parameters can also be monitored. Electrical parameters such as voltage and current can also be monitored in embodiments using single-ended data paths. In the present example, differential voltages exceeding a predetermined level are deemed to be an error, and the supply current is modulated as a flag.

Timing and control of the chopper stabilization of integrator 11 and test block is effectuated with an on-chip oscillator 106. A state machine 107 generates the test control signals described in detail below.

Figure 2:
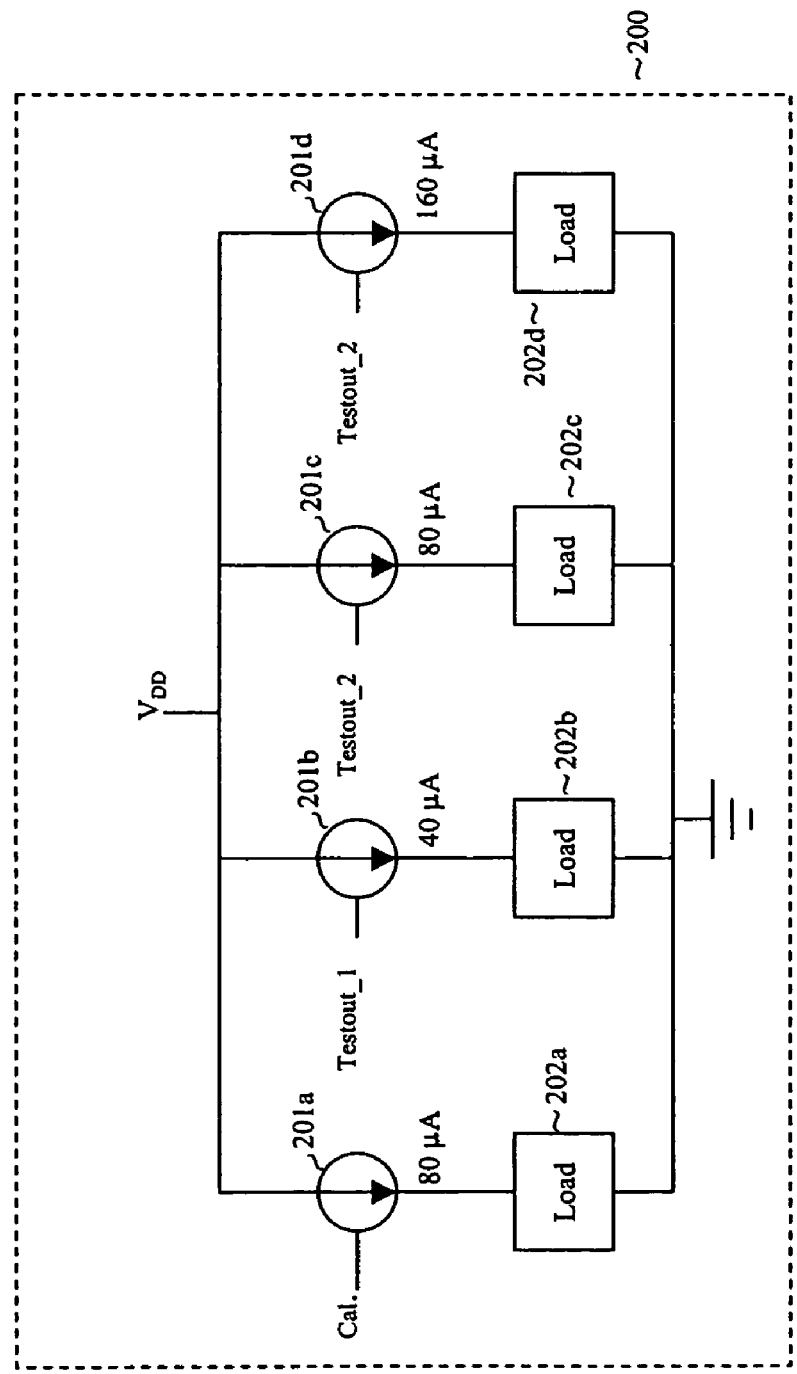
FIG. 2 is a operational block diagram of one exemplary circuit for stepping the supply current to the operational amplifier of FIG. 1 in response to selected test conditions.
Figure 3:
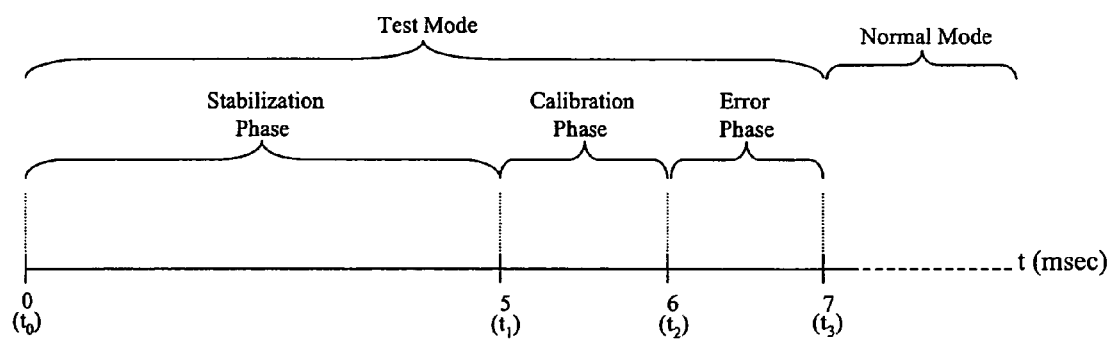
FIG. 3 is a timing diagram illustrating the typical operating regimes of the operational amplifier of FIG. 1.
Figure 5:
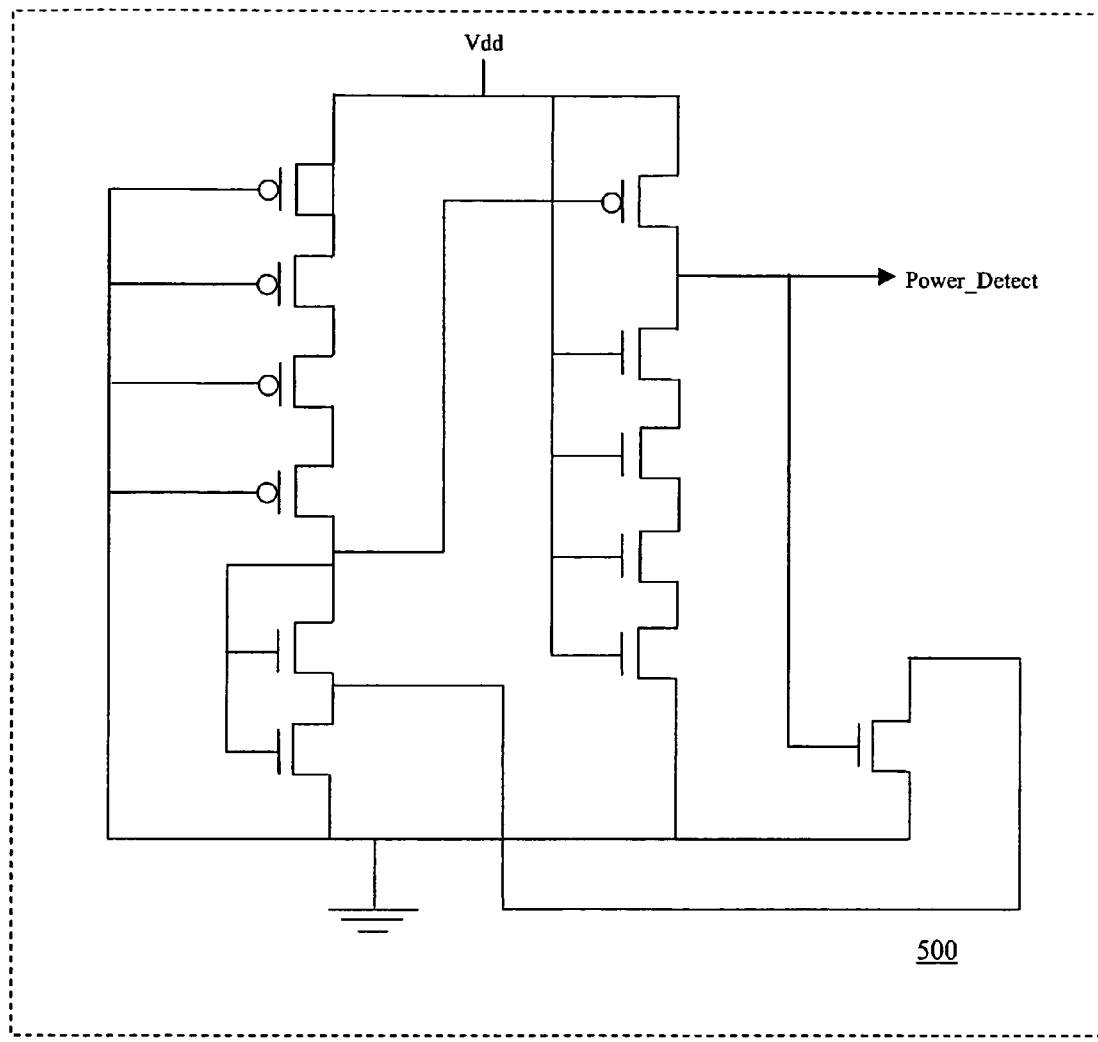
FIG. 5 is an electrical schematic diagram of an exemplary power detect circuit suitable for generating the power detect control signal of FIG. 4B.
Figure 6:
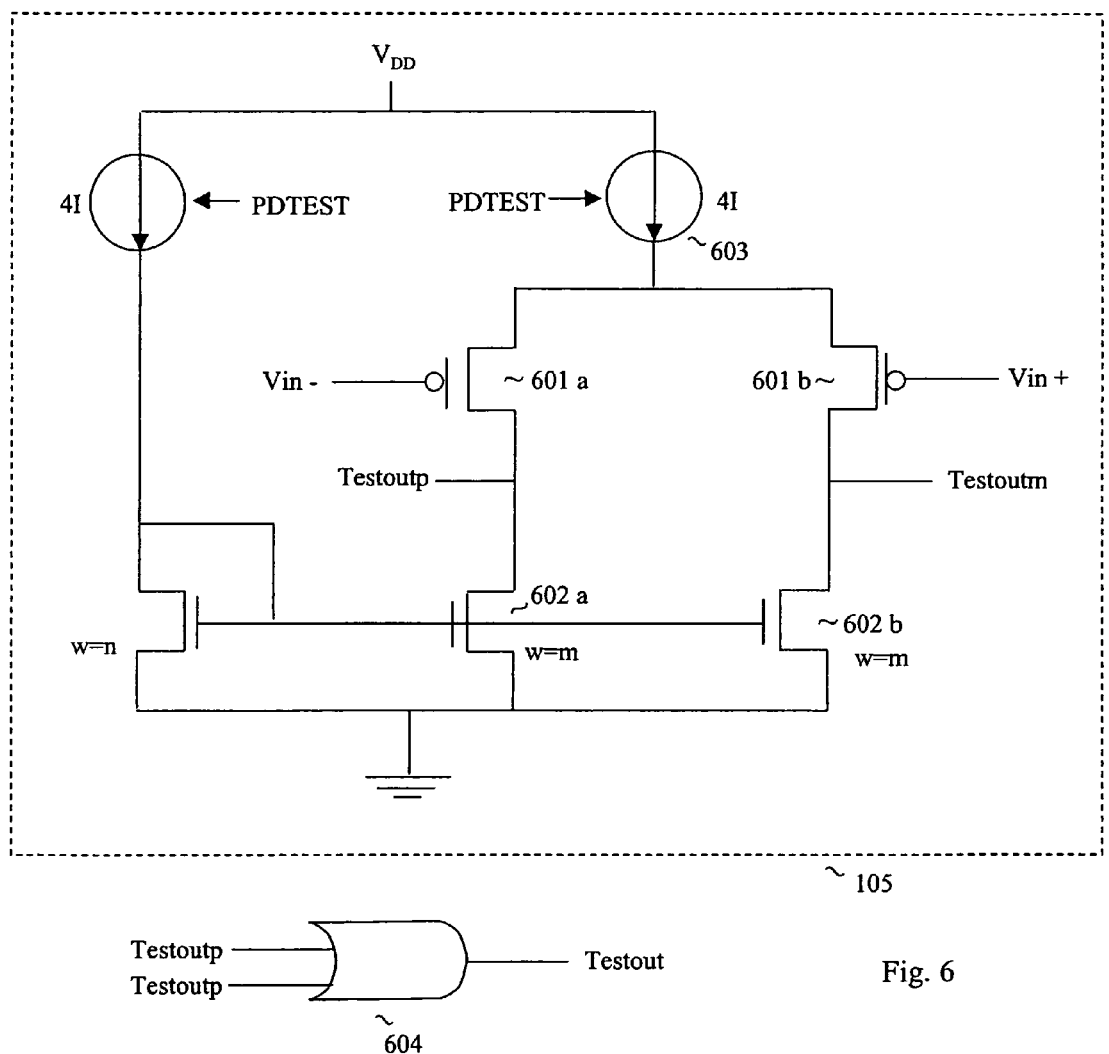
FIG. 6 is an electrical schematic diagram of a selected one of the test circuit blocks shown in FIG. 1.

A high-level operational block diagram of current modulation circuitry 200 which steps the supply current during test mode operations is shown as FIG. 2. Conceptually, current modulation circuitry 200 comprises a plurality of parallel binary-weighted current sources 201a to 201d and associated loads 202a to 202d. Current source 201a is activated during the test mode calibration phase by the control signal Cal while current sources 201b to 201d are activated by the output signals from test blocks 105a to 105c. Current sources 201a to 201d are deactivated in the normal mode, i.e., at the end of the test mode phase.

In the preferred embodiment, test mode operations are observed by monitoring power supply current. For this embodiment, the test mode phase is approximately 7 millisecond in duration and is divided into the time intervals shown in the timing diagram of FIG. 3. During the first interval, of about 5 millisecond (i.e. between times $t_0$ and $t_1$, the internal circuits of op-amp 200 and the external testing instruments are allowed to stabilize to a steady state. This stabilizing time is followed by a second calibration interval of approximately 2 msec. During the first 1 millisecond of the calibration interval, (i.e. between time $t_0$ and $t_2$.), the power supply current is stepped to a calibration current level. Then, in the last 1 millisecond of the calibration interval, (i.e. between time $t_2$ and $t_3$.), the power supply current is stepped as an indication of possible error locations.

An exemplary power current profile during test mode is shown in FIG. 4A. The associated timing and control signals are shown in FIGS. 4B-4F, where FIG. 4B shows the power supply voltage profile, FIG. 4C shows the signal Power_Detect ramping-up with the power supply, and FIGS. 4D-4F illustrate exemplary state machine—generated timing signals activating test blocks 105a to 105c and calibration current source 201a. Specifically, state machine output signal TESTMODE1 indicates that the test mode is active, CAL times the 2 millisecond calibration interval and TESTMODE2 times the final 1 millisecond during which detected errors are identified.

During the first 5 millisecond interval, the current is higher than the nominal value (e.g. room temperature value) since the test mode circuitry is running and therefore requiring power. This interval is followed by a step of 80 microamps of calibration current for 2 msec. As shown in FIG. 2, the power supply current stepping is preferably done by turning-on one or more parallel current sources 201. The calibration current is selected to provide a reference against which the error current steps are measured; if the calibration current source load varies from the specified nominal value for a given device due to fabrication process variations, then the error step current source loads on the same chip should vary similarly from their nominal values such that the absolute relationships between steps remains essentially the same.

In the last 1 millisecond of the test mode (e.g. the error phase from time t2 to t3 in FIG. 3), detected errors, if any, are flagged by an additional current step above the calibration level. In the present three test node example, binary weighted currents of 0, 40, 80 and 160 microamps are used to indicate the results, although other current magnitudes could be used depending on the particular application. The error step is the sum of the individual error currents representing each of the detected errors. For example, if two errors are detected, one represented nominally by 40 microamps and the other nominally by 160 microamps, then the total current step above the calibration level will be nominally 200 microamps. From the external observation point, a measured step of 200 microamps can be uniquely decoded as 40 and 160 microamps parts, representing the designated errors. If no error is detected, then the profile is substantially flat after the 80 microamps calibration step. After the test mode is complete, the power supply current returns to its nominal state current requirement for normal mode operations.

Inducing the test mode when no extra pins are available for this purpose is another problem addressed by the inventive principles. Preferably, a state machine is used which generates the control signals CAL, TESTMODE1 and TESTMODE2. The state machine is activated by power-detect circuitry 500 shown in FIG. 5. Power-detect circuitry 500 generates a pulse when the power supply voltage exceeds a selected threshold, preferably 2 vt of the transistors or, for example, approximately 1.4 volts for transistors with a threshold of 0.7 volts.

While there are numerous parameters which can be tested in accordance with the inventive principles, the three parameters being tested are: (1) the differential voltages at the three test nodes; (2) oscillator frequency; and (3) chopper operation.

In the illustrated embodiment, test blocks 105a to 105b preferably test the offset voltage at various points along the differential data path. One test block 105 (e.g. either 105a, 105b, or 105c) is shown in further detail in FIG. 6. (In this embodiment, the same voltage detection circuit is used for each test node, although the comparator limits may differ.)

Test circuitry 105 includes a difference amplifier including a differential pair of transistors 601a,b responding to the input signals $V_{IN}-$ and $V_{IN}+$ respectively and operating from a current source 603. Corresponding transistors 602a,b are biased such that they operate in the triode (non-saturation) region when transistors 601a,b have no differential input voltage (i.e. $V_{IN}-=V_{IN}+$). The common nodes represent the outputs TESTOUTM and TESTOUTP, which have a low voltage swing of between 0.2 to 0.5 volts. The outputs of the difference amplifier TESTOUTM and TESTOUTP are input into a logic-OR gate 604 which generates TESTOUTX, where x is between 1 and 3 and represents the corresponding test block (node) 105a,c. A voltage difference between $V_{IN}-$ and $V_{IN}+$ divides the current from current source unevenly between transistors 601a and 601b. The magnitude of the voltage difference at the gates of transistors 601a and 601b determines the direction and magnitude of the current split. In particular, if the difference between $V_{IN}-$ and $V_{IN}+$ is sufficiently large, then most of the current is sunk through either transistor 601a or 601b and the corresponding voltage of T<small>ESTOUTP</small> or T<small>ESTOUTM</small> increases enough to cause OR gate 604 to generate the ultimate output signal T<small>ESTOUTX</small> indicating an excessive imbalance at the node being tested.

In the preferred embodiment, each differential voltage detector is tuned by changing the current sources 603 and/or the sizes of transistors 601a,b. Advantageously, the differential voltage detectors shown in FIG. 6 sense node voltages without interfering with signal transmission through the tested nodes. Additionally, the preferred circuitry is turned-off (with the PDTEST signal) when the normal mode of operation begins.

The oscillator frequency is derived by a time measurement over the last 2 millisecond interval of the test mode. Specifically, the current steps at times t1 and t3 are used to define the 2 millisecond period over which counter 107 or similar circuit is used to count periods of the oscillator. The oscillator frequency can be derived from the time measurement between t1 and t3.

Figure 7:
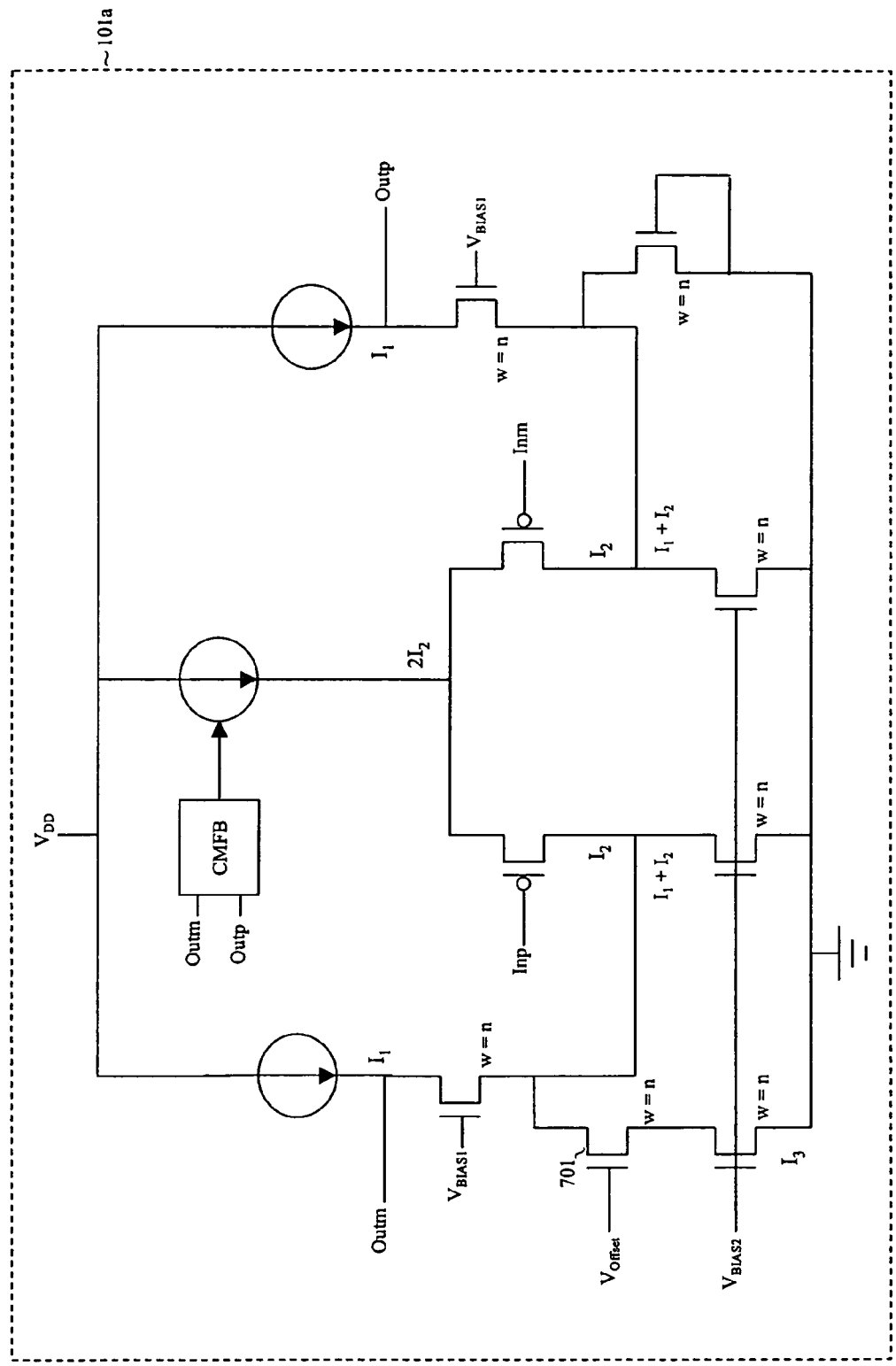
FIG. 7 is an electrical schematic diagram of an exemplary chopper-stabilized integrator suitable for use in selected ones of the integrator stages of FIG. 1.

In the preferred embodiment of op-amp 100, integrator 101a (I1) is based on a chopper-stabilized amplifier as shown in FIG. 7, where the common mode feedback is represented by "CMFB". Chopper-stabilized amplifiers normally and ideally chop their internal offsets. Hence, to test integrator 11, an offset $V_{offset}$ is introduced at one of the integrator differential inputs pair transistor. If no difference is detected between the output offset voltage either during the 7 millisecond test mode or normal operation, then the chopper is functioning correctly.

Figure 8A:
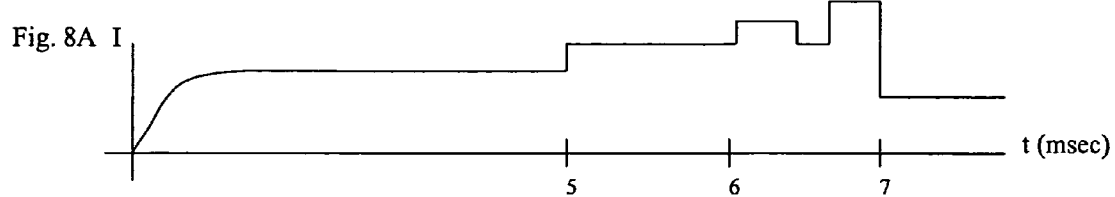
FIGS. 8A and 8B are current profiles illustrating alternate methods of modulating the power supply current in response to selected test conditions.
Figure 8B:
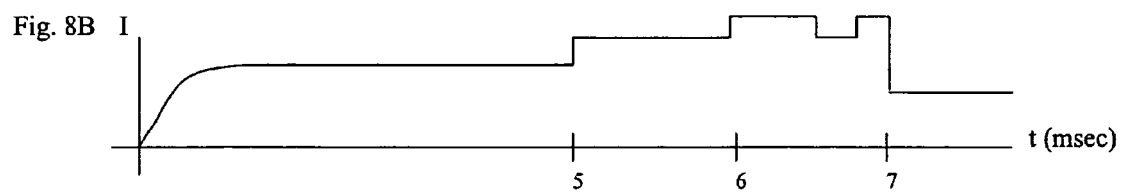

It should be recognized that there are a number of alternate ways in which supply current can be modulated, two of which are shown in FIGS. 8A and 8B. Generally, the number of current levels needed to encode all possible error combinations is $2^n$ where n is the number of state variables to be monitored. In other words, when n increases, the required levels increase exponentially, thus limiting n to 3 or 4.

In one alternate time-multiplexed encoding, n is divided into smaller numbers and then each number is encoded. For example, if n is 4, the division can be made into two sequences and then each sequence coded as described above. The typical current waveform may look as shown in FIG. 8A.

In another embodiment, pulse width modulation can be used to modulate power supply current with the code. Advantageously, this technique can be used to monitor a large number of state variables in short testmode times. If the number of state variables to be monitored is large, then it can also be divided into smaller groups and a pulse width modulated sequence can be used for each number as shown in FIG. 8B.

Additionally, there are alternate ways in which the test mode can be induced. In any event, the conditions or mechanism which induces the self test mode should not be normally present or occurring during normal operation of the op amp. Moreover, the self test should only last for a short time (e.g., in this example the duration of the self test is for 7 milliseconds). In one alternate embodiment, both the differential input pins (e.g. INPUT signal in FIG. 1) are connected momentarily to 0.3 volts below the lowest power supply voltage to the chip. Internally, a simple comparator circuit senses the voltage and triggers the state machine as described above. (This voltage should be lower than the lowest power supply voltage but higher than −0.7 volts at which voltage protection diodes at input pins (not shown) start conducting and should not be asserted during normal operation). A variation of this technique is to keep the input voltage lower for a specified time period to reduce the possibility of accidental inducement o the test mode more.

Figure 9:
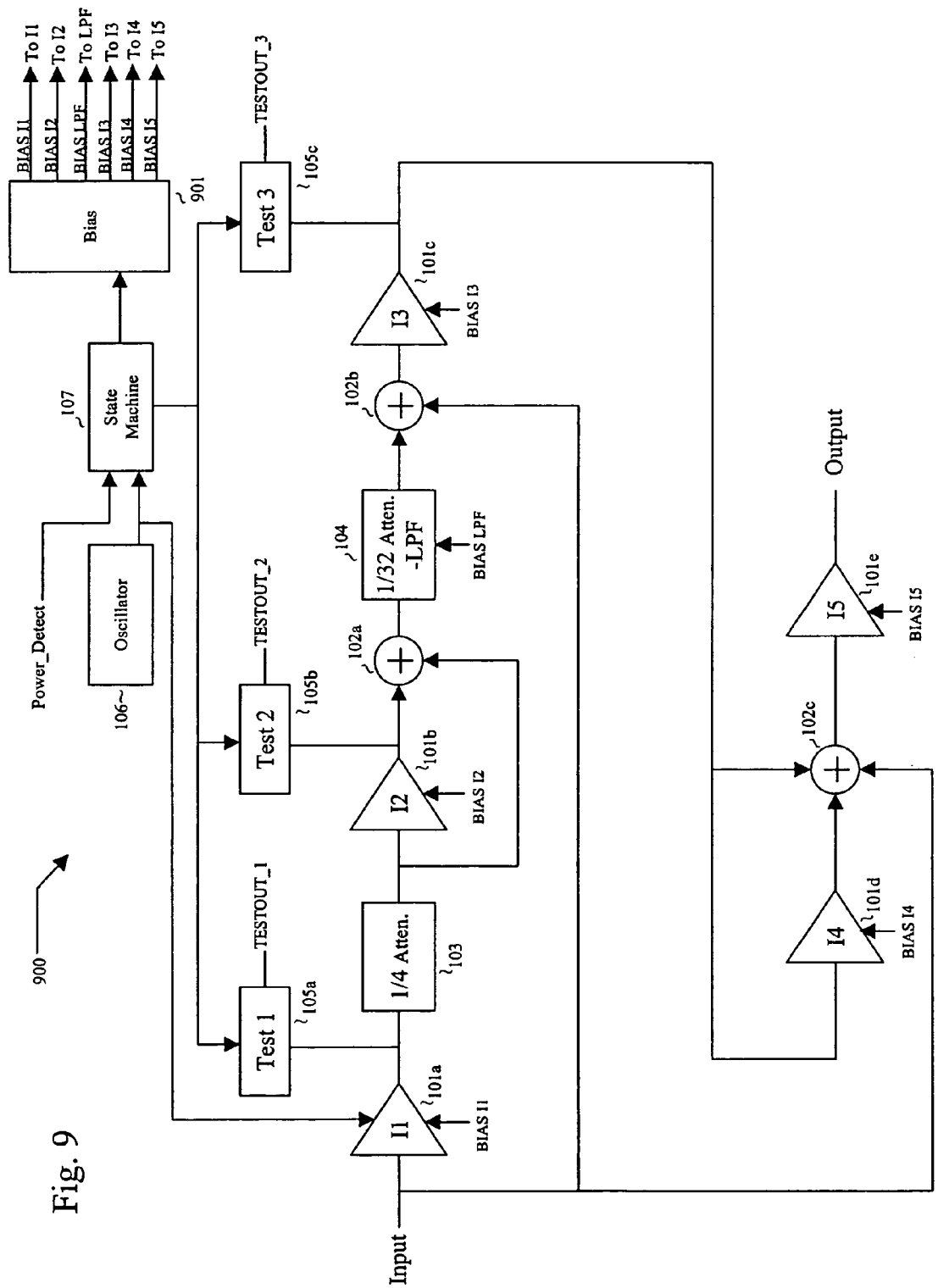
FIG. 9 is a operational block diagram of a second exemplary multipath feedforward operational amplifier embodying the present inventive principles.

FIG. 9 is a block diagram of a multiple-stage feed-forward operational amplifier 900 according to a further embodiment of the principles of the present invention. Operational amplifier 900 includes the structures described above with respect to operational amplifier 100, along with a bias generator 901 which provides bias currents B<small>IASI</small>1, B<small>IASI</small>2, B<small>IASI</small>3, B<small>IASI</small>4, B<small>IASI</small>5, and B<small>IASLPF</small> respectively to integrators stages 11-15 (blocks 101a-101e), and the lowpass filter (LPF) of attenuator-lowpass filter block 104. Bias generator 901 provides the bias currents B<small>IASI</small>1 B<small>IASI</small>2, B<small>IASI</small>3, B<small>IASI</small>4, B<small>IASI</small>5, and B<small>IASLPF</small> during normal operations of operational amplifier 100, and during testing, allows these bias currents to be varied in order to efficiently detect marginal or failing internal circuit blocks.

Specifically, in the test mode, bias generator 901 allows the internal nodes of operational amplifier 100 to be tested under nominal test conditions (e.g. room temperature) using bias currents predicted to emulate the worst case bias conditions expected to occur while operational amplifier 100 is under stress (e.g. high or low operating temperature). Once the bias currents B<small>IAS</small>1, B<small>IAS</small>2, B<small>IAS</small>3, and B<small>IASLPF</small> have been varied, offset voltage tests, such as those described above with respect to operational amplifier 100, are performed to verify internal operations of amplifier 900. Consequently, marginal internal blocks, such as integrators I1-I3 and the lowpass filter of block 104, which may fail under stress conditions can be efficiently detected under nominal test conditions.

Figure 10:
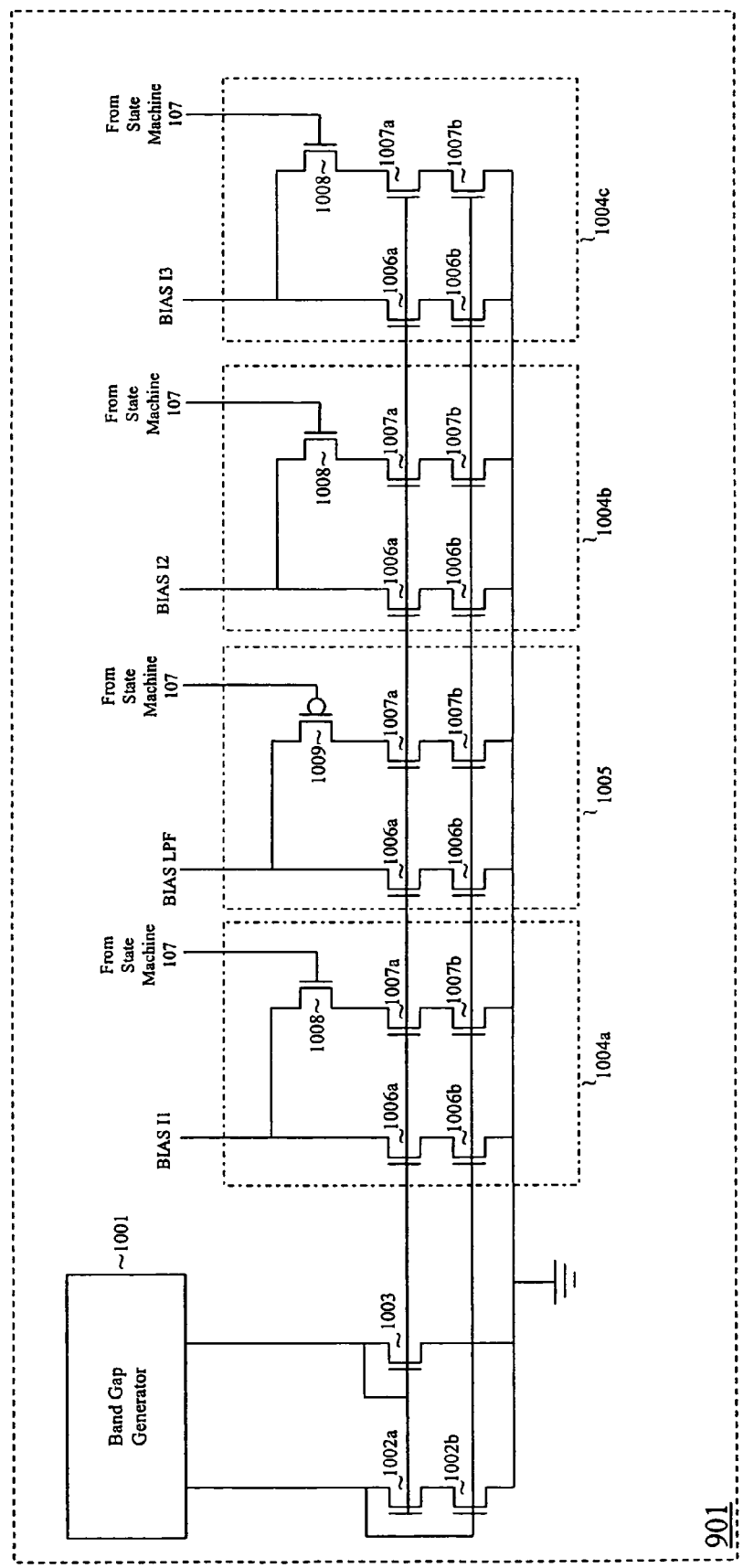
FIG. 10 is an electrical schematic diagram of an exemplary variable bias current generator suitable for utilization in the representative operational amplifier of FIG. 9.
Figure 11:
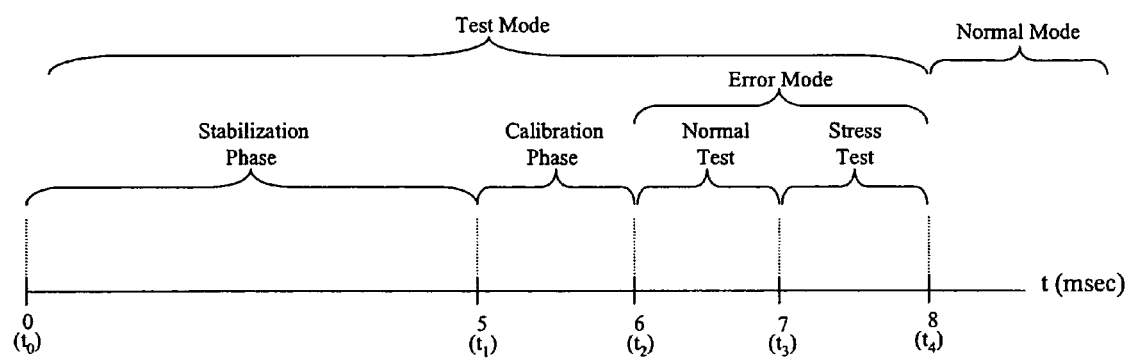
FIG. 11 is a timing diagram illustrating the typical operating regimes of the operational amplifier of FIG. 9.

An exemplary embodiment of bias generator 901 is shown in detail in the electrical schematic diagram of FIG. 10. While bias currents B<small>IASI</small>1, B<small>IASI</small>2, B<small>IASI</small>3, and B<small>IASLPF</small> are shown being generated in the embodiment of FIG. 10 for integrators I1-I3 and the lowpass filter of attenuator-LPF block 104, the illustrated concepts may be extended to the generation of variable bias currents B<small>IASI</small>4 and, B<small>IASI</small>5, to integrators I4-I5, and other on-chip circuitry as well.

A band gap generator 1001 establishes a reference current through n-channel transistors 1002a and 1002b. Transistors 103 generates the bias voltage for cascade transistors 102a, 106a and 107a. The base bias currents B<small>IASI</small>1, B<small>IASI</small>2, B<small>IASI</small>3, respectively for integrators I1, I2 and I3 of FIG. 9 are generated, for both normal and test mode conditions, by current mirror blocks 1004a-1004c. Normal test and stress test mode base bias current values for BIASLPF are generated for the lowpass filter by current mirror block 1005. The operation of current mirror blocks 1004a-1004c and 1005, which will be described further below, is essentially the same, although in the illustrated embodiment the test mode control logic for current mirror block 1005 is the inverse of that controlling current mirror blocks 1004a-1004c.

Current mirror blocks 1004a-1004c and 1005 each include a pair of n-channel transistors 1006a-1006b which mirror the reference current through transistors 1002a-1002b to set the corresponding bias current BIAS1, BIAS2, BIAS3, or BIASLPF during normal and test mode operations. In addition, each current mirror block 1004a-1004c and 1005 includes a second pair of transistors 1007a-1007b, which selectively mirror the reference current through transistors 1002a-1002b during the stress test mode. For current mirror blocks 1004a-1004c, the current paths through transistors 1007a and 1007b are each controlled by an n-channel transistor 1008 and state machine 107 of FIG. 9. Transistors 1007a and 1007b of current mirror block 1005 are controlled by state machine 107 through a p-channel transistor 1009.

To emulate the bias currents predicted for worse case stress conditions, state machine 107 steps any or all of the bias current B<small>IAS</small>1, B<small>IAS</small>2, B<small>IAS</small>3, and B<small>IASLPF</small> from their base values generated by the current mirrors of transistors 106a and 106b of current mirror blocks 1004a-1004c and 1005, by activating the corresponding transistors 1008 or 1009. For example, to step the bias current $B_{IAS}1$, state machine 107 of FIG. 9 activates transistor 1008 of current mirror block 1004a, to step the bias current $B_{IASLPF}$, state machine 107 activates transistor 1009 of current mirror block 1005, and so on.

The inverse logic of n-channel and p-channel transistors 1008 and 1009 allows the bias current to the low pass filter of attenuator-LPF block 1005 block to be decreased relative to the bias current to integrators I1-I3, and vice versa. The bias currents $B_{IAS}1$, $B_{IAS}2$, $B_{IAS}3$, and $B_{IASLPF}$ are stepped simultaneously, sequentially, or in any combination required to induce the worst case bias current conditions in amplifier 900 as predicted for a given stress on amplifier 900. Consequently, any marginal circuits within amplifier 900 are forced to fail under nominal test conditions which eliminates the need to generally test operational amplifier 900 under stress conditions.

The results of emulating stresses on the various blocks of operational amplifier 100 by varying the internal bias currents are preferably detected using the voltage offset measurements described above, although in alternate embodiments other tests or measurements may be performed. Hence, when a set of bias currents are stepped by bias generator 901 to produce a predicted worst case set of operating conditions, the test blocks $T_{EST}1$, $T_{EST}2$, and $T_{EST}3$ detect any out of specification offset voltages indicative of a marginal or failing circuit block.

As shown in FIGS. 11 and 12A-12F, state machine 107 of operational amplifier 900 (see FIG. 9) performs a series of tests at selected internal nodes, similar to those previously described with respect to operational amplifier 900, however, in conjunction with FIGS. 3 and 4A-4F. Amplifier 900, however, is further operable in the extended test mode shown in FIG. 11, which includes both normal test period, during which the tests described above are conducted with the nominal (base) bias currents, and a stress mode in which the bias currents are stepped in order to test under emulated worst case stress conditions. In this example, an additional millisecond is added to the test sequence time and state machine 107 generates the timing for an additional testmode period shown as Testmode3 in FIG. 12G. Alternatively, operational amplifier may be tested only in the stress mode or only in the normal test mode, depending on the test protocol.

Alternatively, one or more of the bias currents $B_{IAS}1$, $B_{IAS}2$, $B_{IAS}3$, and $B_{IASLPF}$ is fixed during testing under nominal test conditions. In this case, potential failures under actual stress conditions are identified by varying (tightening) the test constraints imposed on the tested operating parameter. For example, predictions are made to determine a range of offset voltages measured at the output of a given amplifier stage 101a-101c which corresponds to the proper operation of that amplifier stage 101a-101c under stress conditions. Measurements of an offset voltage by the associated test block 105a-105c under nominal test conditions which exceed the predicted range are then deemed as indicating a failure of the associated amplifier stage 101a-101c.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of testing an internal block of an integrated circuit comprising:
    initiating a test mode;
    verifying an operation of the integrated circuit under a more stringent condition in the test mode as compared to a condition in another operating mode such that proper operation of the integrated circuit is assured in the another operating mode, wherein verifying an operation of the integrated circuit under a more stringent condition comprises measuring an operating parameter of the internal block against a more stringent limit value during the test mode compared to a limit value for the operating parameter in the another operating mode; and
    selectively outputting a test signal from a selected pin in the test mode indicative of the operation of the internal block, wherein the selected pin is utilized for exchanging another signal when the integrated circuit is in the another operating mode.

2. The method of testing of claim 1, wherein the more stringent limit value comprises a reduced maximum allowable value of the operating parameter.

3. The method of testing of claim 1, wherein the more stringent limit value comprises an increased minimum allowable value of the operating parameter.

4. The method of testing of claim 1, wherein verifying an operation of the integrated circuit in the test mode comprises testing the integrated circuit at a temperature and measuring a selected operating parameter of the internal block against a more stringent limit value compared to a limit value for the operating parameter in the another operating mode to assure proper operation of the integrated circuit at another temperature in the another operating mode.

5. The method of testing of claim 1, wherein verifying an operation of the integrated circuit in the test mode comprises testing the integrated circuit at a selected power supply voltage and measuring a selected operating parameter of the internal block against a more stringent limit value compared to a limit value for the operating parameter in the another operating mode to assure proper operation of the integrated circuit at another power supply voltage in the another operating mode.

6. The method of testing of claim 1, wherein verifying an operation of the integrated circuit in the test mode comprises testing a voltage offset at a selected node of the internal block against a reduced maximum voltage offset limit value compared to a maximum voltage offset limit value in the another operating mode to assure proper operation of the internal block with a larger voltage offset at the selected node in the another operating mode.

7. The method of testing of claim 1, wherein verifying an operation of the integrated circuit in the test mode comprises varying a bias current to the internal block to emulate a worst case operating condition of the internal block in the another operating mode and in response comparing an operating parameter of the internal block against a limit value.

\* \* \* \* \*